United States Patent

Immel et al.

(10) Patent No.: US 6,962,191 B2
(45) Date of Patent: Nov. 8, 2005

(54) FIXATION OF A HEAT-EXCHANGER CASSETTE

(75) Inventors: Manfred Immel, Mittenaar (DE); Reiner Hartmann, Wettenberg (DE); Joachim Maul, Ehringshausen (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 10/818,465

(22) Filed: Apr. 5, 2004

(65) Prior Publication Data

US 2004/0256084 A1 Dec. 23, 2004

(30) Foreign Application Priority Data

Apr. 4, 2003 (DE) .......................................... 103 15 753

(51) Int. Cl.[7] .............................. F24F 7/08; F24F 7/007

(52) U.S. Cl. ............................. 165/54; 165/78; 165/76; 165/166

(58) Field of Search ............................. 165/54, 76, 78, 165/166

(56) References Cited

U.S. PATENT DOCUMENTS

| 4,377,201 A | * | 3/1983 | Kruse et al. ................... 165/76 |
| 4,512,392 A | * | 4/1985 | van Ee et al. ................. 165/54 |

FOREIGN PATENT DOCUMENTS

| JP | 63129234 A | * | 6/1988 | ............. F24F/7/08 |
| JP | 63194192 A | * | 8/1988 | ............. F28F/3/10 |
| JP | 64088048 A | * | 4/1989 | ............. F24F/7/08 |
| JP | 05288381 A | * | 11/1993 | ............. F24F/7/08 |
| JP | 06026683 A | * | 2/1994 | ............. F24F/7/08 |
| JP | 06207730 A | * | 7/1994 | ............. F24F/7/08 |
| JP | 09072593 A | * | 3/1997 | ............. F24F/7/08 |

* cited by examiner

*Primary Examiner*—John K. Ford
(74) *Attorney, Agent, or Firm*—Pauley Petersen & Erickson

(57) ABSTRACT

A device for fixing and sealing a replaceable heat-exchanger cassette in an air/air heat exchanger, wherein two spatially separated conducting areas are formed by separating strips and the heat exchanger cassette. In this case a releasable and satisfactory sealing support of the heat exchanger cassette is achieved because in the area of its separating strips the air/air heat exchanger has sealing receivers. The heat exchanger cassette rests against the sealing receivers by sealing faces. The air/air heat exchanger has at least one movable slide which maintains the heat exchanger cassette in the sealing receivers under prestress.

17 Claims, 2 Drawing Sheets

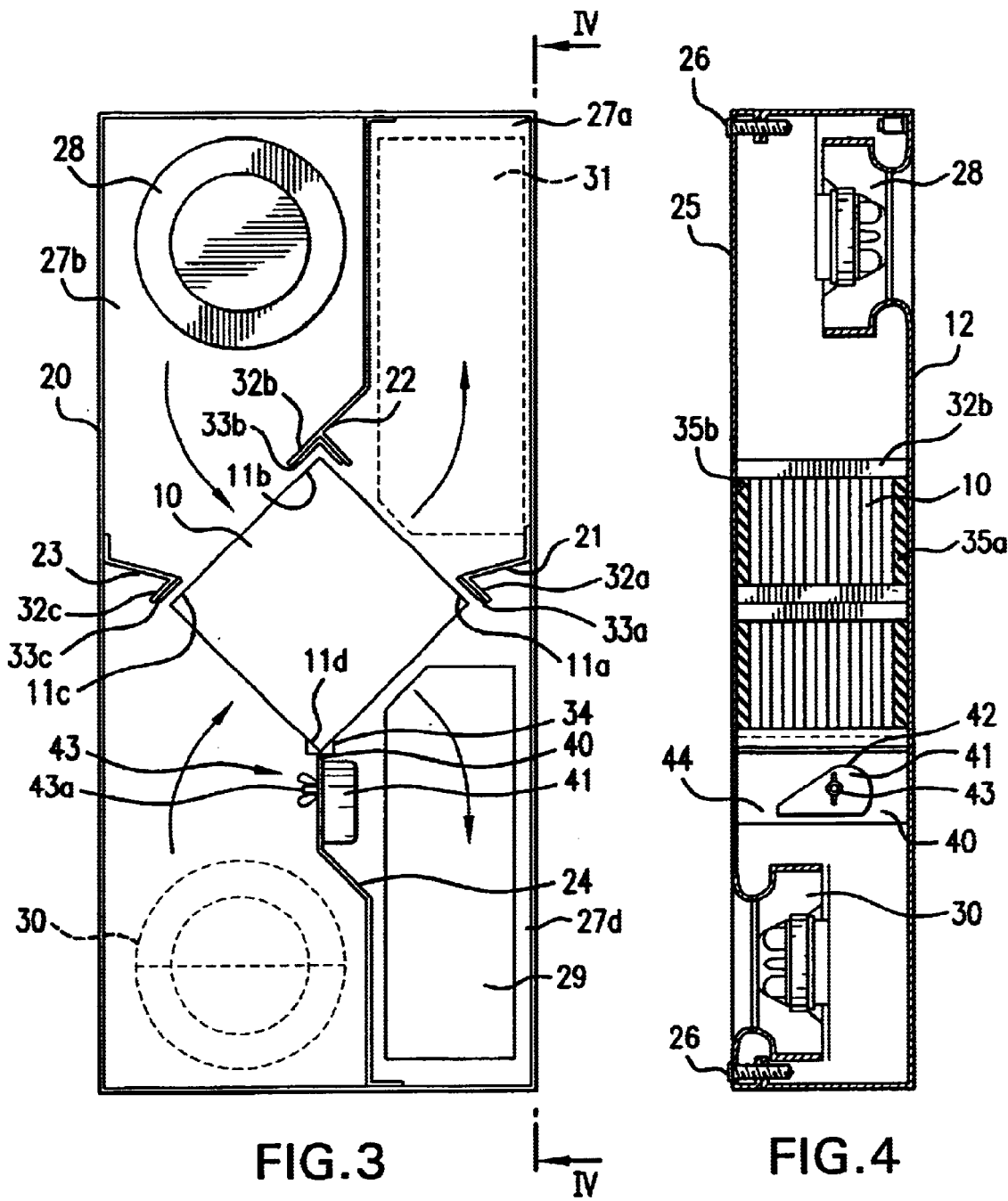

FIXATION OF A HEAT-EXCHANGER CASSETTE

BACKGROUND OF THE INVENTION

1. Field of the Invention

This invention relates to a device for fixing and sealing a replaceable heat exchanger cassette in an air/air heat exchanger, wherein two spatially separated conducting areas are formed by separating strips and the heat exchanger cassette.

2. Discussion of Related Art

Known air/air heat exchangers are frequently employed in air conditioning telecommunications installations, and in connection with IT technology, traffic control technology, in external industrial installations, in environmental technology and energy distribution. Thus, the heat exchanger can be mounted at various positions on a housing, such as in the door, on one of the lateral walls or on the roof.

With known heat exchangers it is important to prevent moisture or dust from being transferred into the interior of the housing. For this purpose, air/air heat exchangers have an interior air circuit and a separate exterior air circuit. A fan is arranged for each one for conveying air. The heat is transferred from the interior air circuit to the exterior air circuit in a heat exchanger cassette, through which both air streams move in separate conduits or fins. It is important for both air circuits to be separated from each other.

To assure sufficient heat transfer it is necessary to clean the heat exchanger cassette at regular intervals, which are a function of the respective environmental conditions at the place of their employment. For cleaning purposes the heat exchanger cassette is removed from the air/air heat exchanger.

The sealing elements between the heat exchanger cassette and the housing of the air/air heat exchanger must not lose their sealing effect because of the removal and reinstallation. Thus the heat exchanger cassettes of conventional heat exchangers are glued in or fastened by screwed auxiliary elbows.

The glued type has very good sealing effects but for removing the heat exchanger cassette, one disadvantage is that the glued connection can only be severed in an elaborate manner. The cost for gluing the heat exchanger cassette during mounting is also very large.

The removal and reinstallation of the heat exchanger cassette in installations with screwed auxiliary elbows is also connected with an increased mounting cost.

SUMMARY OF THE INVENTION

It is one object of this invention to provide a fixation and sealing of a heat exchanger cassette of the type mentioned above but which allows a simple and dependable removal and reinstallation of the heat exchanger cassette.

This object is attained with, in an area of its separating strips, the air/air heat exchanger having sealing receivers. The heat exchanger cassette rests against the sealing receivers with sealing faces. The air/air heat exchanger has at least one movable slide, which maintains the heat exchanger cassette in the sealing receivers under prestress. An easily releasable fixation of the heat exchanger cassette is accomplished with the slide. Because the heat exchanger cassette is pressed against the sealing receivers by the slide, a satisfactorily sealed point of separation, which can be easily and repeatedly released, is provided between the chambers of the interior air circulation and the chambers of the exterior air circulation of the air/air heat exchanger.

In one embodiment of this invention, the slide can be operated by an eccentric lever. With a small outlay of force the slide can be firmly pressed against the heat exchanger cassette with an eccentric lever. It is thus possible to mount the heat exchanger cassette with little effort and it can be pressed against the sealing receivers with a sufficient pressure force.

An even pressure force against the sealing receivers over the entire length of the sealing faces is achieved because the action point of the eccentric lever is positioned transversely with respect to the displacement direction of the slide in the center of the slide. Tilting the slide while tightening the eccentric lever is thus prevented.

In accordance with one embodiment of this invention, the slide is fastened on one of the separating strips and has a bridging section. The bridging section has a seal resting against an associated sealing face of the heat exchanger cassette. The bridging section and the seal bridge the transition area between the free end of the separating strip and the heat exchanger cassette. With this simple step, in the closed state the slide separates the two adjoining chambers forming the air supply conduits of the air/air heat exchanger in the extension of the separating strip.

Easy displacement of the slide in the released state and a dependable fixation of the eccentric, and thus of the slide, in the installed state of the heat exchanger cassette is achieved because the slide has an opening shaped as an elongated hole as a slide guide. The opening is aligned with a receiver in the separating strip and a receiver of the eccentric lever. A fastening screw is passed through the opening of the slide and the receivers of the separating strip and the eccentric lever and is secured with a nut.

A cost-effective construction and good sealing between the sealing faces of the heat exchanger cassette and the corresponding sealing receivers is obtained because the sealing receivers are formed on the separating strips by surfaces matched to the sealing faces of the heat exchanger cassette and seals are arranged between the sealing receivers and the sealing faces.

In order to rapidly and exactly position the heat exchanger cassette, along with simultaneous good seating in the area between the slide and the heat exchanger cassette during installation, a seal with a preferably V-shaped profile is arranged between the slide and the associated edge, embodied as a sealing face, of the heat exchanger cassette.

Very good sealing of the side of the heat exchanger cassette assigned to the slide is achieved because the slide and the seals have the same height as the heat exchanger cassette.

In one embodiment, the seals are fixedly attached to the slide and the sealing receivers. This allows as rapid as possible an installation or removal of the heat exchanger cassette without an additional mounting cost for positioning the seals.

In another embodiment the seals are fixedly attached to the sealing faces of the heat exchanger cassette. This also makes possible a rapid installation or removal of the heat exchanger cassette without an additional mounting cost for positioning the seals. Also, with this embodiment the seals are renewed when the heat exchanger cassette is replaced.

A cost-effective construction of the air/air heat exchanger, along with a simultaneous good sealing effect between the conducting areas is achieved because the air/air heat exchanger has a housing bottom on which a lateral face of the heat exchanger cassette is sealingly supported. The separating strips are connected to and rise upward from the housing bottom. The separating strips support the sealing receivers extending parallel with each other. The slide is adjustable substantially perpendicularly with respect to the longitudinal extension of the sealing receivers. A housing cover closes the air/air heat exchanger parallel with the housing bottom. The housing cover is sealingly seated on the side of the heat exchanger cassette facing away from the housing bottom.

In one embodiment of this invention, when viewed from above, the heat exchanger cassette is symmetrically constructed. Thus the heat exchanger cassette can be installed in one of four possible positions, without mistake.

BRIEF DESCRIPTION OF THE DRAWINGS

This invention is explained in greater detail in view of an exemplary embodiment represented in the drawings, wherein:

FIG. 3 shows the air/air heat exchanger in accordance with FIGS. 1 and 2 in a different mounted position and in a top view; and FIG. 4 shows the air/air heat exchanger in accordance with FIG. 3 in a front view in a direction along the section line identified by IV—IV in FIG. 3.

DESCRIPTION OF PREFERRED EMBODIMENTS

Figures 1, 2:
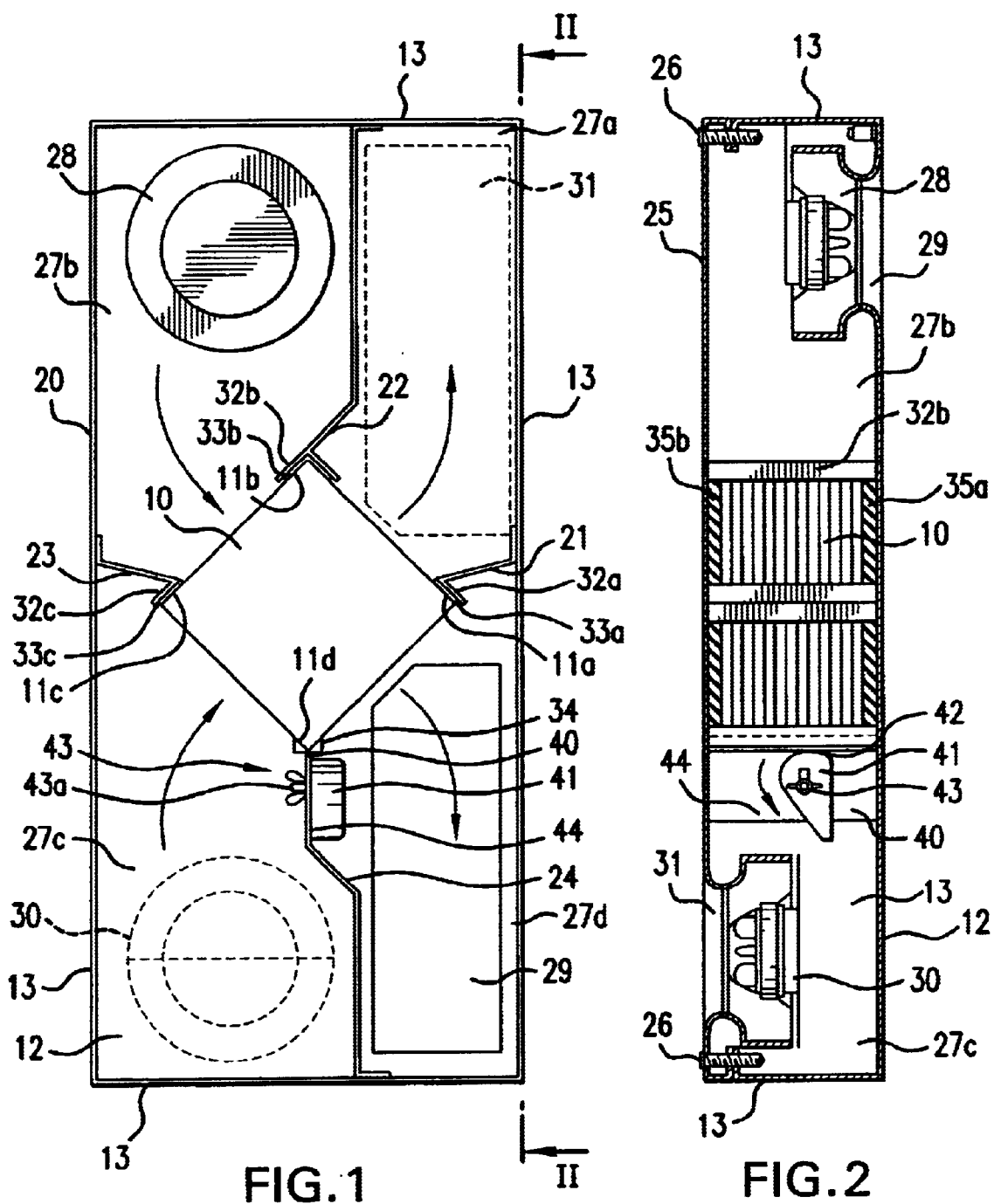
FIG. 1 shows an air/air heat exchanger with a heat exchanger cassette in a top view.
FIG. 2 shows the air/air heat exchanger in accordance with FIG. 1 in a front view in a direction along the section line identified by II—II in FIG. 1.

FIG. 1 shows an air/air heat exchanger 20 in a top view. As shown, the air/air heat exchanger 20 has a housing with a housing bottom 12 and four lateral walls 13 connected therewith. As shown in FIG. 2, the open housing side can be closed off by a housing cover 25. The housing interior is divided into four chambers 27a to 27d by four separating strips 21 to 24. The separating strips 21 to 24 are connected in an air-tight manner with the housing bottom 12 and each of the associated lateral walls 13. As shown in FIG. 2, the separating strips 21 to 24 extend over the entire height of the housing interior. The separating strips 21 to 24 are equipped with sealing receivers 32a to 32c on their free ends. The separating strip 22 forms a sealing receiver 32b, which is V-shaped in cross section. The separating strips 21 and 23 each form a flat sealing receiver 32a and 32c.

A slide 40 is arranged opposite the V-shaped sealing receiver 32b on the free end of the separating strip 24. The slide 40 has a plate-shaped support section 44 which is laterally placed against the separating strip 24. In its area extending beyond the free end of the separating strip 24, the support section 44 has a bridging section which terminates in a sealing receiver that is V-shaped in cross section. The sealing receiver is located opposite the V-shaped sealing receiver 32b of the separating strip 22. Seals 33a to 33c, or 34, are affixed to the sealing receivers 32a to 32c of the separating strips 21 to 23 and to the one of the slide 40. The seals 33a to 33c and 34 extend over the entire height of the housing interior. A heat exchanger cassette 10 can be installed in the receiving chamber formed between the seals 33a to 33c and 34. The heat exchanger cassette 10 has a plurality of fins which extend parallel with each other and separate conducting areas. Thus, respectively two groups of conducting areas are formed. These are alternatingly conducted to two air conducting sections of the air/air heat exchanger 20. The separating strips 21 to 24 separate four chambers 27a to 27d in the housing interior. Respectively, two chambers 27a and 27c, or 27b and 27d, are in spatial connection with each other via the heat exchanger cassette 10 and thus form an air conducting area. The two air conducting areas cross each other in the area of the heat exchanger cassette 10. The first air conducting area formed by the chambers 27b and 27d is a part of the interior circuit. The second air conducting area formed by the chambers 27a and 27c is a part of the exterior circuit. The interior circuit is connected with the interior of a connected switch gear cabinet via openings 29 in the housing bottom 12 of the chambers 27b and 27d. The exterior circuit is connected via openings 31 with the outside. Fans, such as interior fan 28 and/or exterior fan 30, are assigned to the respective openings 29 and 31 of the interior and exterior circuits and convey the air conducted through the interior and exterior circuits.

In the mounted position shown in FIG. 1, the heat exchanger cassette 10 is maintained in the sealing receivers 32a to 32c. Here, the heat exchanger cassette 10 is pressed against the seals 32a to 32c and 34 by the slide 40, acted upon by an eccentric lever 41. The eccentric lever 41 has an opening which is aligned with an opening in the separating strip 24. An elongated hole has been cut into the slide 40. A fastening screw 43a can be passed through the openings and the elongated hole and can be secured with a wing nut for forming a screw connection. A handle section pivoted on one side can actuate the eccentric lever 41. The eccentric lever 41 can thus be displaced. During displacement, an eccentric section of the eccentric lever 41 engages with a counter-face of the slide 40 and displaces the slide 40 in the direction toward the heat exchanger cassette.

In the final mounting position shown in FIGS. 1 and 2, the eccentric lever 41, and simultaneously the slide 40, can be arrested by simply tightening the screw connection 43. Then the heat exchanger cassette 10 is securely held in the seals 33a to 33c and 34. Finally, the housing cover 25 can be put down and screwed on, for example by using screw connections 26. A seal 35b is placed on the inside of the cover 25 and seals the free front side of the heat exchanger cassette 10.

For replacing the heat exchanger cassette 10, it is only necessary to unscrew the screw connection 43 and to put the eccentric lever 41 into the removal position. The released heat exchanger cassette 10 can then be taken out. The removal position is shown in FIGS. 3 and 4.

German Patent Reference 103 15 753.0-34, the priority document corresponding to this invention, and its teachings are incorporated, by reference, into this specification.

What is claimed is:

1. A device for fixing and sealing a replaceable heat-exchanger cassette (10) in an air/air heat exchanger (20), wherein two spatially separated conducting areas are formed by separating strips (21, 22, 23, 24) and the heat exchanger cassette (10), the device comprising:

the air/air heat exchanger (20) having sealing receivers (32a to 32c) in an area of separating strips (21 to 24), the heat exchanger cassette (10) resting against the sealing receivers (32a to 32c) with sealing faces (11a to 11d), and the air/air heat exchanger (20) having at least one movable slide (40) maintaining the heat exchanger cassette in the sealing receivers (32a to 32c) under prestress, the slide (40) fastened on one of the separating strips (21, 22, 23, 24) and having a bridging section with a seal (34) resting against an associated sealing face (11d) of the heat exchanger cassette (10), and the bridging section and the seal (34) bridging a transition area between a free end of the separating strip (24) and the heat exchanger cassette (10), the slide (40) having an opening shaped as an elongated hole acting as a slide guide, the opening aligned with a receiver in the separating strip (24) and a receiver of the eccentric lever (41), and a fastening screw (43a) passing through the opening of the slide (40) and the receivers of the separating strip (24) and the eccentric lever (41) and secured with a nut.

2. The device in accordance with claim 1, wherein the sealing receivers (32a to 32c) are formed on the separating strips (21, 22, 23) by surfaces matched to the sealing faces (11a to 11c) of the heat exchanger cassette (10), and seals (33a to 33c) are arranged between the sealing receivers (32a to 32c) and the sealing faces (11a to 11c).

3. The device in accordance with claim 1, wherein a seal (34) having a V-shaped profile is arranged between the slide (40) and an associated edge formed as a sealing face (11d) of the heat exchanger cassette (10).

4. The device in accordance with claim 1, wherein the slide (40) and the seals (33a to 33c, 34) have a same height as the heat exchanger cassette (10).

5. The device in accordance with claim 1, wherein the seal (34) is fixedly attached to the slide (40), and seals (33a to 33c) are fixedly attached to the sealing receivers (32a to 32c).

6. The device in accordance with claim 1, wherein seals (33a to 33c, 34) are fixedly attached to the sealing faces (11a to 11d) of the heat exchanger cassette (10).

7. The device in accordance with claim 1, wherein the air/air heat exchanger (20) has a housing bottom (12) on which a lateral face of the heat exchanger cassette (10) is sealingly supported, the separating strips (21 to 24) are connected to and rise upward from the housing bottom (12), the separating strips (21 to 24) support the sealing receivers (32a to 32c) extending parallel with each other, the slide (40) is adjustable substantially perpendicularly with respect to a longitudinal extension of the sealing receivers (32a to 32c), a housing cover (25) closes the air/air heat exchanger parallel with the housing bottom (12), and the housing cover (25) is sealingly seated on a side of the heat exchanger cassette (10) facing away from the housing bottom (12).

8. The device in accordance with claim 1, wherein when viewed from above the heat exchanger cassette (10) is formed symmetrically.

9. The device in accordance with claim 1, wherein an eccentric lever (41) operates the slide (40).

10. The device in accordance with claim 1, wherein an action point (42) of the eccentric lever (41) is positioned transversely to a displacement direction of the slide (40) in a center position of the slide.

11. The device in accordance with claim 10, wherein the sealing receivers (32a to 32c) are formed on the separating strips (21, 22, 23) by surfaces matched to the sealing faces (11a to 11c) of the heat exchanger cassette (10), and seals (33a to 33c) are arranged between the sealing receivers (32a to 32c) and the sealing faces (11a to 11c).

12. The device in accordance with claim 11, wherein a seal (34) having a V-shaped profile is arranged between the slide (40) and an associated edge formed as a sealing face (11d) of the heat exchanger cassette (10).

13. The device in accordance with claim 12, wherein the slide (40) and seals (33a to 33c, 34) have a same height as the heat exchanger cassette (10).

14. The device in accordance with claim 13, wherein the seal (34) is fixedly attached to the slide (40), and the seals (33a to 33c) are fixedly attached to the sealing receivers (32a to 32c).

15. The device in accordance with claim 13, wherein the seals (33a to 33c, 34) are fixedly attached to the sealing faces (11a to 11d) of the heat exchanger cassette (10).

16. The device in accordance with claim 15, wherein the air/air heat exchanger (20) has a housing bottom (12) on which a lateral face of the heat exchanger cassette (10) is sealingly supported, the separating strips (21 to 24) are connected to and rise upward from the housing bottom (12), the separating strips (21 to 24) support the sealing receivers (32a to 32c) extending parallel with each other, the slide (40) is adjustable substantially perpendicularly with respect to a longitudinal extension of the sealing receivers (32a to 32c), a housing cover (25) closes the air/air heat exchanger parallel with the housing bottom (12), and the housing cover (25) is sealingly seated on a side of the heat exchanger cassette (10) facing away from the housing bottom (12).

17. The device in accordance with claim 16, wherein when viewed from above the heat exchanger cassette (10) is formed symmetrically.

\* \* \* \* \*